United States Patent

[11] 3,564,115

[72] Inventors Maurice Woolmer Gribble Stockport; Glyn Charles Evans, Wilmslow, England
[21] Appl. No. 781,930
[22] Filed Dec. 6, 1968
[45] Patented Feb. 16, 1971
[73] Assignee Ferranti, Limited Hollinwood, Lancashire, England
[32] Priority Dec. 8, 1967
[33] Great Britain
[31] 55818/67

[54] ELECTRICAL INTERCONNECTION GRIDS
5 Claims, 4 Drawing Figs.

[52] U.S. Cl. .......... 174/68.5; 29/625; 317/101; 339/18
[51] Int. Cl. .......... H05k 1/04
[50] Field of Search .......... 174/68.5; 317/101 (CX); 339/17, 18; 29/625—627; 156/3

[56] References Cited

UNITED STATES PATENTS

| | | | |
|---|---|---|---|
| 3,142,112 | 7/1964 | Burkig et al .......... | 174/68.5X |
| 3,465,091 | 9/1969 | Bradham .......... | 174/68.5 |

FOREIGN PATENTS

| | | | |
|---|---|---|---|
| 297,408 | 11/1965 | Netherlands .......... | 174/68.5 |

*Primary Examiner*—Darrell L. Clay
*Attorney*—Cameron, Kerkam & Sutton

ABSTRACT: An electrical interconnection grid consists of two sets of parallel conductors on opposite sides of an insulating board. At least one set of conductors consists of pairs of conductors interconnected at intervals by a conductive strip which is connected to a conductor of the other set by a plated-through hole.

ELECTRICAL INTERCONNECTION GRIDS

THIS INVENTION relates to electrical interconnection grids and patterns for the same.

Electrical interconnection grids are used in the assembly of miniature and microminiature electronic circuits. The object is to eliminate wired interconnections between components and to use instead interconnections provided by a regular pattern of conductive strips carried on an insulating member. Basically an interconnection grid consists of a regular pattern of conductors formed on an insulating board, usually by printed circuit methods. Holes are drilled through the board and the conductors so that the connecting leads of circuit components may be passed through the holes and soldered to the conductors. The required electric circuit is formed by breaking the conductors at various required points. Frequently, to enable the number of interconnections to be increased, sets of conductors are formed on both sides of the insulating board, with the conductors on one side arranged at an angle to those on the other side. Holes are made through conductors of both sets, and often the holes are through-plated to interconnect conductors of both sets.

The main problem with existing interconnection grids is that there are insufficient conductors relative to the number of points to which components may be attached. Each part of a conductor which is connected to a component must then form part of the circuit to adjacent components, and this means that a large number of possible connection points for components cannot be used.

An object of the invention is to provide an electric interconnection grid in which the possible number of interconnection paths is increased.

According to the present invention an electrical interconnection grid comprises two sets each of electrical conductors parallel to one another and secured to opposite sides of an insulating member with the conductors of one set disposed at an angle with respect to the conductors of the other set, the conductors of at least one set being in pairs, the two conductors of each of which pairs are interconnected at spaced locations along the pair by a conductive strip in electrical connection with a conductor of the other set by way of an aperture through the insulating member lined with conductive material and each of which pairs of conductors is electrically isolated from each other pair on the same side of the insulating member.

The invention will now be described with reference to the accompanying drawings, which are not necessarily correct in terms of scale or proportion, and wherein.

Figure 1:
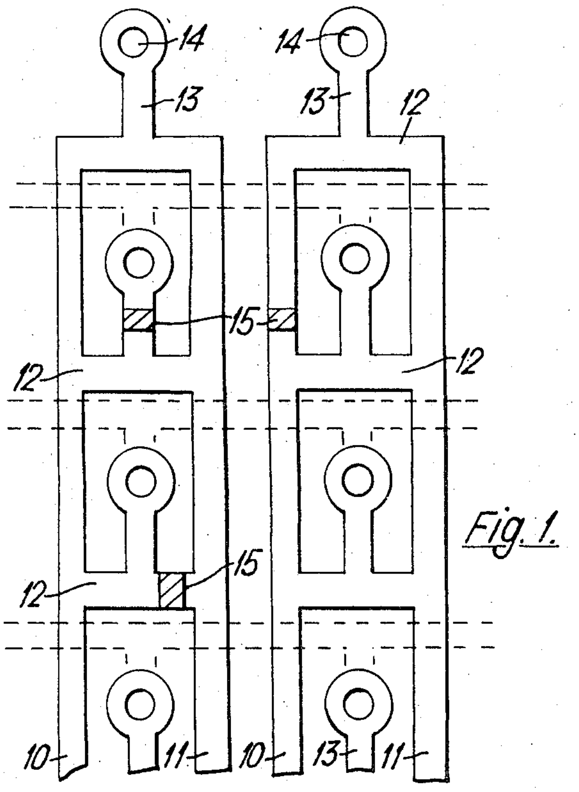
FIG. 1 is a plan view of part of one form of interconnection grid embodying the invention.

Referring now to FIG. 1, this shows one form of interconnection pattern, the conductors of one set being shown in full, and those of the other set being shown in broken outline. The pattern shown in full consists of pairs of straight parallel conductors secured to an insulating board, the conductors of each pair being electrically isolated from those of each other pair on the same side of the insulating board. The two conductors 10 and 11 of a pair of conductors are connected together at regular spaced locations by conductive strips 12. Each connecting strip has connected to it a lug 13 having an enlarged end through which is drilled a hole 14 passing through the insulating board.

On the other side of the board is arranged a second set of conductors electrically isolated from one another. These may be arranged in the same pattern as the first set or may, as shown, be arranged in a different pattern, so long as the holes in the two patterns are in register. The conductors of one set are disposed at an angle with respect to those of the other set, preferably at right angles to them as shown. The holes 14 drilled through the board are connected to the conductors of the two sets by through-plating the holes 14. Thus each conductor on one side of the board is connected to each of the conductors on the other side of the board.

In order to make use of the interconnection grid, the route of each part of the circuit has to be determined. Components are attached to the grid by soldering the wire leads or terminal pins of the components into particular ones of the plated-through holes 14. The circuit is formed by cutting the conductors 10 and 11, connecting strips 12 or lugs 13 at specified points, as indicated at 15. This also applies to the conductors on the other side of the board, and the required circuit is formed by the interconnections remaining.

Figure 2:
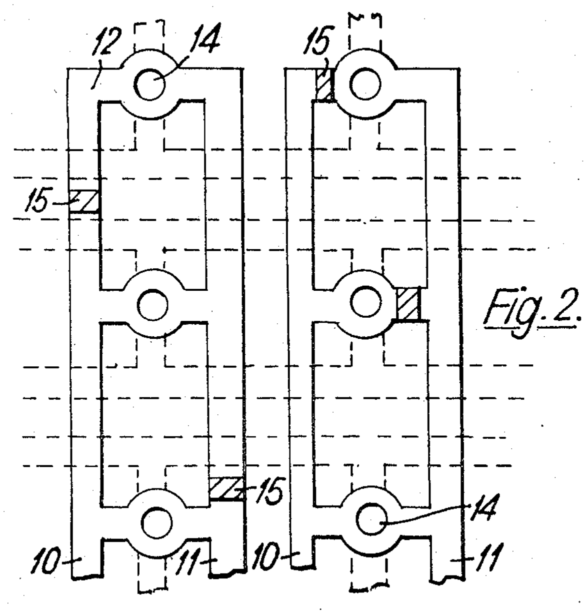
FIG. 2 is a plan view similar to FIG. 1 showing an alternative pattern of interconnection grid.

FIG. 2 shows an alternative pattern for the interconnection grid, and in this example the same pattern is used on the opposite side of the board. The difference between this pattern and that of FIG. 1 is that the holes 14 are formed directly through the connecting strips 12. This arrangement has the slight disadvantage that isolation of the hole by cutting the connecting strip 12 also interrupts a connection between the two conductors 10 and 11.

Figure 3:
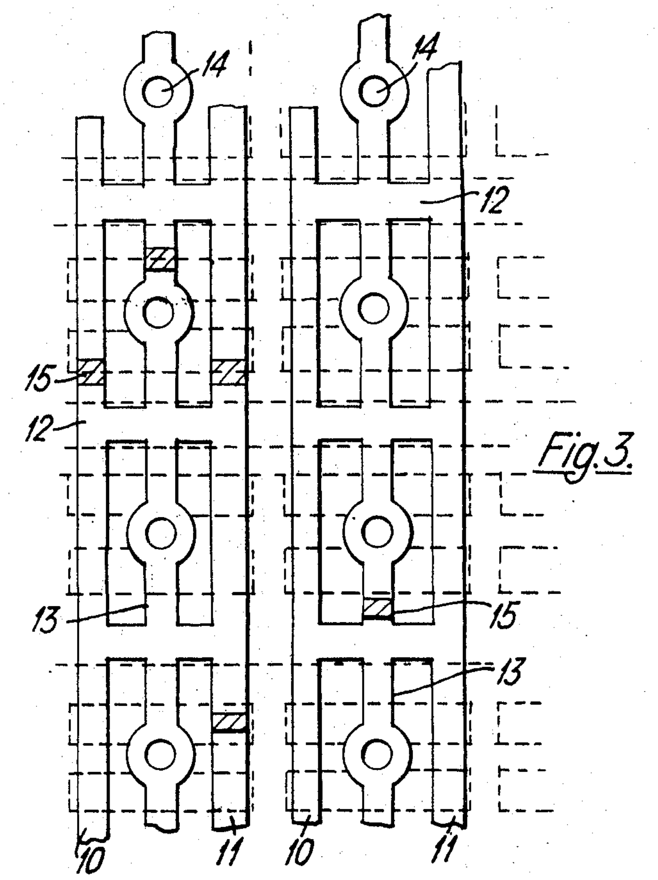
FIG. 3 is a plan view similar to FIG. 1 showing a modification of the interconnection grid of FIG. 1.

FIG. 3 shows another interconnection pattern, this being a modification of the pattern of FIG. 1. In this pattern the lug 13 extends on both sides of the enlarged portion through which the aperture 14 is formed, and hence the aperture is connected to two adjacent connecting strips 12. Hence all the apertures between a pair of conductors 10 and 11 are connected together through the lugs 13. This pattern is more versatile than the two already described, especially when the pattern on the other side of the board is the same.

Figure 4:
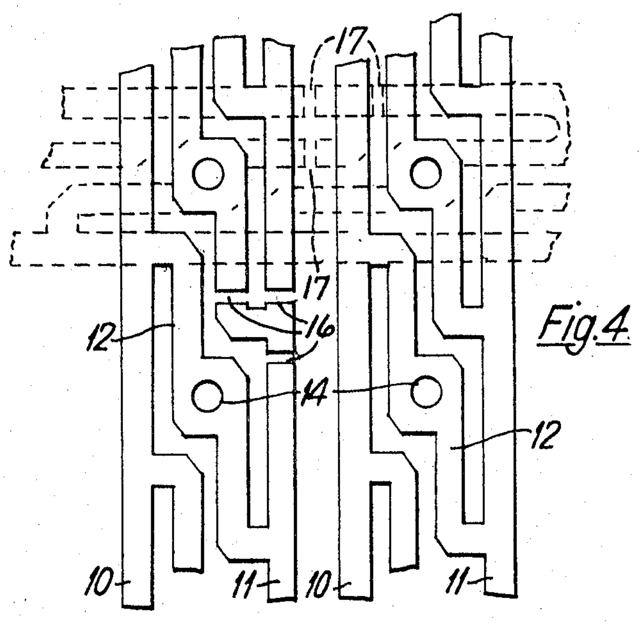
FIG. 4 is a fragmentary plan view of still another interconnection grid embodying the invention.

The embodiment of FIG. 4, though employing an interconnection grid basically similar to that of FIG. 2, has been designed with a different purpose in mind. In the case of the three grids already mentioned, one set of conductors is located on each of the opposite sides of a board, and the two sets of conductors are cut as required. This necessarily involves cutting conductors on one side of the board, turning the board over, and then cutting the conductors on the other side. The interconnection grid of FIG. 4, however, was specifically intended to be used with a very thin insulating layer, and is arranged so that all cuts may be made from one side. This results in an increased speed of preparation, especially when an automatic machine is used for the purpose.

Referring now to FIG. 4, the pattern on each side of the insulating layer consists of pairs of straight parallel conductors 10 and 11, interconnected at regular intervals by connecting strips 12 carrying plated-through apertures 14. The connecting strips 12 are not arranged at right angles to the conductors 10 and 11 as is the case in FIG. 2, but have a considerable length running parallel to the conductors. This achieves maximum separation between the conductive portion of both patterns, as will be seen from FIG. 4. Only one pair of conductors of the pattern on the underside of the insulation are shown in FIG. 4. The insulating layer is of such a thickness that a machine used for cutting through the conductors always cuts right through the insulating layer as well. For this reason the insulating layer carrying the two patterns is carried on a thicker insulating board.

FIG. 4 also shows the manner in which the conductors may be cut. The breaks in the conductors at the location 16 indicate cuts through the conductors on the upper surface of the board, while the breaks at locations 17 indicate cuts through conductors on the lower surface. Only a few such cuts are shown by way of example.

The interconnection grid shown in FIG. 4 may be used on a thicker insulating board in the same manner as the other grids described.

The holes 14 are spaced at regular intervals over the surfaces of the board. A convenient spacing is 0.1 inch between adjacent parallel conductors. Other spacings may however be used.

Other patterns of interconnection grid may be used provided that the conductors on at least one surface of the board form parallel pairs with each plated-through hole leading from between the conductors of a pair to at least one conductor on the other surface. It is not essential for the parallel conductors to be straight, though that is usually the most convenient arrangement.

As already stated, the pattern of conductors is readily formed by printed circuit techniques. However, other techniques, such as metallic deposition through a mask, may be used.

We claim:

1. An electrical interconnection grid comprising two sets each of electrical conductors parallel to one another and secured to opposite sides of an insulating member with the conductors of one set disposed at an angle with respect to the conductors of the other set, the conductors of at least one set being in pairs the two conductors of each of which pairs are interconnected at spaced locations along the pair by conductive strips each of which is in electrical connection with a conductor of the other set by way of an aperture through the insulating member lined with conductive material, each of which pairs of conductors is electrically isolated from each other pair on the same side of the insulating member.

2. An interconnection grid as claimed in claim 1 in which the conductors of one set are arranged perpendicular to the conductors of the other set.

3. An interconnection grid as claimed in claim 1 in which the conductors of the other set are also in pairs interconnected at spaced locations along the pair by conductive strips each of which is in electrical connection with a conductive strip of said one set by way of one of said apertures.

4. An interconnection grid as claimed in claim 1 in which the conductors of the other set are also in pairs interconnected at spaced locations along the pair by conductive strips each of which is in electrical connection with a conductive strip of said one set by way of one of said apertures, and in which each aperture is formed through a conductive strip.

5. An interconnection grid as claimed in claim 1 in which the conductors of the other set are also in pairs interconnected at spaced locations along the pair by conductive strips each of which is in electrical connection with a conductive strip of said one set by way of one of said apertures, and in which each aperture is formed through a conductor projecting from but in electrical contact with a conductive strip.